US011553629B2

(12) United States Patent
Lee et al.

(10) Patent No.: US 11,553,629 B2
(45) Date of Patent: Jan. 10, 2023

(54) SHIELDING MEMBER AND ELECTRONIC DEVICE INCLUDING THE SAME

(71) Applicant: Samsung Electronics Co., Ltd., Suwon-si (KR)

(72) Inventors: Myeonggil Lee, Suwon-si (KR); Hyein Park, Suwon-si (KR); Jangsun Yoo, Suwon-si (KR); Jaedeok Lim, Suwon-si (KR); Jihye Moon, Suwon-si (KR); Cheehwan Yang, Suwon-si (KR); Kwangyong Lee, Suwon-si (KR); Moonhee Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 116 days.

(21) Appl. No.: 17/142,705

(22) Filed: Jan. 6, 2021

(65) Prior Publication Data

US 2021/0219470 A1    Jul. 15, 2021

(30) Foreign Application Priority Data

Jan. 9, 2020   (KR) .......................... 10-2020-0003206

(51) Int. Cl.
*H05K 9/00* (2006.01)
*H05K 7/20* (2006.01)
(Continued)

(52) U.S. Cl.
CPC ........... *H05K 9/0024* (2013.01); *H01L 25/18* (2013.01); *H05K 1/18* (2013.01); *H05K 7/20509* (2013.01);
(Continued)

(58) Field of Classification Search
CPC .................................................... H05K 9/0037
See application file for complete search history.

(56) References Cited

U.S. PATENT DOCUMENTS

2015/0216091 A1* 7/2015 Kwon ................... H04B 15/04
361/760
2018/0198305 A1* 7/2018 Hwang ................... H02J 50/23
(Continued)

FOREIGN PATENT DOCUMENTS

KR    10-2018-0102528 A    9/2018
KR    10-2019-0014865 A    2/2019
KR    10-2020-0049392 A    5/2020

*Primary Examiner* — Hung V Ngo
(74) *Attorney, Agent, or Firm* — Jefferson IP Law, LLP

(57) ABSTRACT

An electronic device including a shielding member for performing an electromagnetic interference (EMI) shielding function is provided. The electronic device includes a printed circuit board including a first area in which first electronic components having a first frequency as a driving frequency are mounted, and a second area in which second electronic components having a second frequency as a driving frequency are mounted, a shielding film disposed to cover the first area and the second area of the printed circuit board and attached to a first ground portion of the printed circuit board, and at least one conductive member formed to extend in a direction perpendicular to an extending direction of the printed circuit board. The at least one conductive member includes a first end that contacts the shielding film, and a second end that contacts a second ground portion of the printed circuit board, the second end being disposed between the first area and the second area of the printed circuit board.

14 Claims, 8 Drawing Sheets

(51) Int. Cl.
*H01L 25/18* (2006.01)
*H05K 1/18* (2006.01)

(52) U.S. Cl.
CPC .......... *H05K 9/009* (2013.01); *H05K 9/0037* (2013.01); *H05K 9/0039* (2013.01); *H05K 9/0083* (2013.01); *H05K 9/0088* (2013.01); *H05K 2201/10371* (2013.01)

(56) References Cited

U.S. PATENT DOCUMENTS

2020/0137931 A1    4/2020  Lee et al.
2021/0015008 A1*  1/2021  Ohkubo ............... H05K 9/0037

* cited by examiner

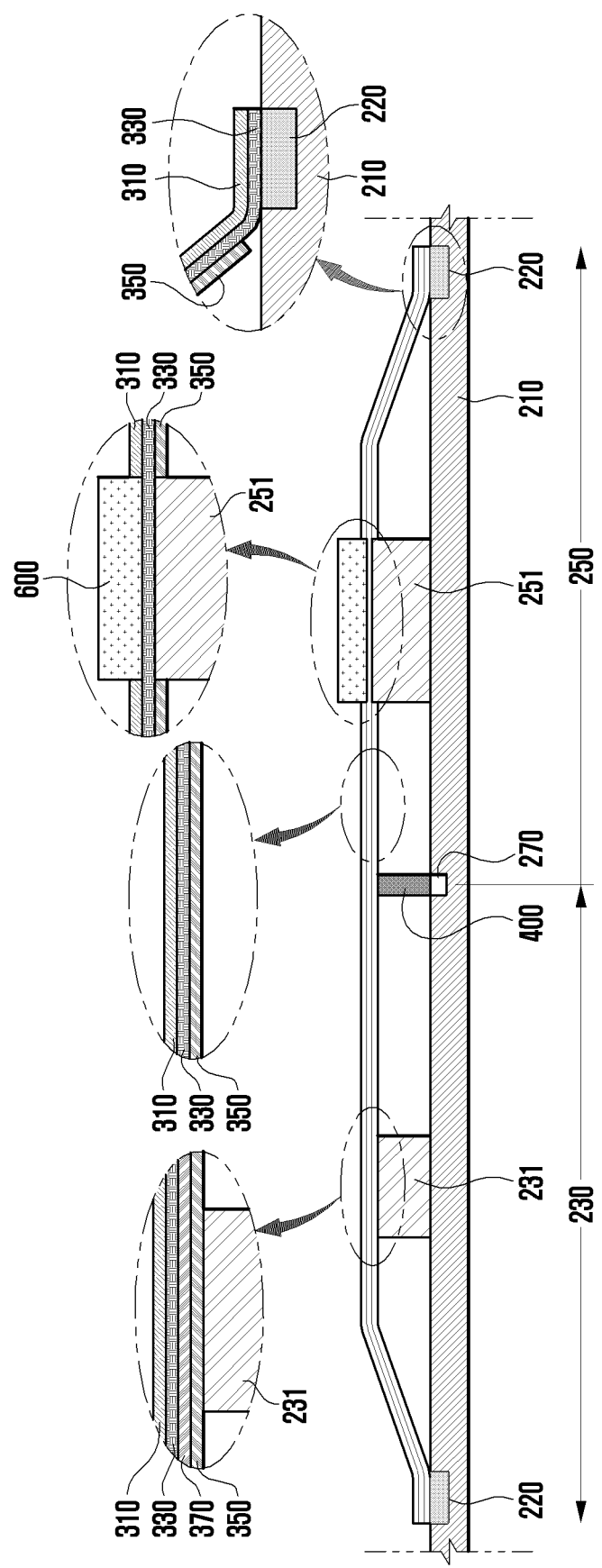

SHIELDING MEMBER AND ELECTRONIC DEVICE INCLUDING THE SAME

CROSS-REFERENCE TO RELATED APPLICATION(S)

This application is based on and claims priority under 35 U.S.C. § 119 of a Korean patent application number 10-2020-0003206, filed on Jan. 9, 2020, in the Korean Intellectual Property Office, the disclosures of each of which is incorporated by reference herein in its entirety.

BACKGROUND

1. Field

The disclosure relates to a shielding member for performing an electromagnetic interference (EMI) shielding function and an electronic device including the same.

2. Description of Related Art

Electronic devices such as smart phones, tablet personal computers (PCs), and computers are becoming smaller, slimmer, and multifunctional.

Accordingly, electronic components constituting electronic devices are also becoming highly integrated, and a signal processing speed thereof is also increasing. In a process in which electronic components perform signal processing, noise in the form of electromagnetic waves is generated. Noise generated from highly integrated electronic components is a major cause of malfunction or inefficient operation of adjacent electronic components.

EMI shielding may mean technology that guarantees a normal operation of electronic components by blocking noise generated from the electronic components from being transferred to the outside and that protects the electronic components. For example, by using EMI shielding, noise generated from an IC chip may be prevented from being induced to an antenna wiring or an antenna.

When a film type shielding member is used for EMI shielding, the shielding member may be attached to a ground line of a printed circuit board. A width of a ground line needs to be sufficiently secured so that the film type shielding member may be stably adhered to the printed circuit board.

In designing the disposition of electronic components included in an electronic device, in consideration of a shielding performance, components having a driving frequency of a similar frequency band are generally disposed adjacent to each other. Thereby, there may be a plurality of areas in which components are mounted in the printed circuit board.

When a plurality of areas is covered with the film type shielding member, a ground line for attaching the shielding member is required between the areas. As described above, the ground line needs to secure a sufficient width. For this reason, a problem may occur that a mounting area of the printed circuit board is reduced because of the ground line formed between the areas.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a shielding member for performing an electromagnetic interference (EMI) shielding function and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a printed circuit board including a first area in which first electronic components having a first frequency as a driving frequency are mounted, and a second area in which second electronic components having a second frequency as a driving frequency are mounted, a shielding film disposed to cover the first area and the second area of the printed circuit board and attached to a first ground portion of the printed circuit board, and at least one conductive member formed to extend in a direction perpendicular to an extending direction of the printed circuit board. The at least one conductive member includes a first end that contacts the shielding film, and a second end that contacts a second ground portion of the printed circuit board, the second end being disposed between the first area and the second area of the printed circuit board.

In accordance with an aspect of the disclosure, an electromagnetic shielding member is provided. The electromagnetic shieling member includes a shielding film disposed to cover both a first area of a printed circuit board on which first electronic components having a first frequency as a driving frequency are mounted and a second area of the printed circuit board on which second electronic components having a second frequency as a driving frequency are mounted, and attached to a first ground portion of the printing circuit board, and at least one conductive member formed to extend in a direction perpendicular to an extending direction of the printed circuit board. The at least one conductive member includes a first end that contacts the shielding film, and a second end that contacts a second ground portion of the printed circuit board and disposed between the first area and the second area of the printed circuit board.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description taken in conjunction with the accompanying drawings, in which:

FIG. 6B is a cross-sectional view taken along line B-B of the printed circuit board illustrated in FIG. 5 according to an embodiment of the disclosure.

Throughout the drawings, like reference numerals will be understood to refer to like parts, components, and structures.

DETAILED DESCRIPTION

Figure 1:
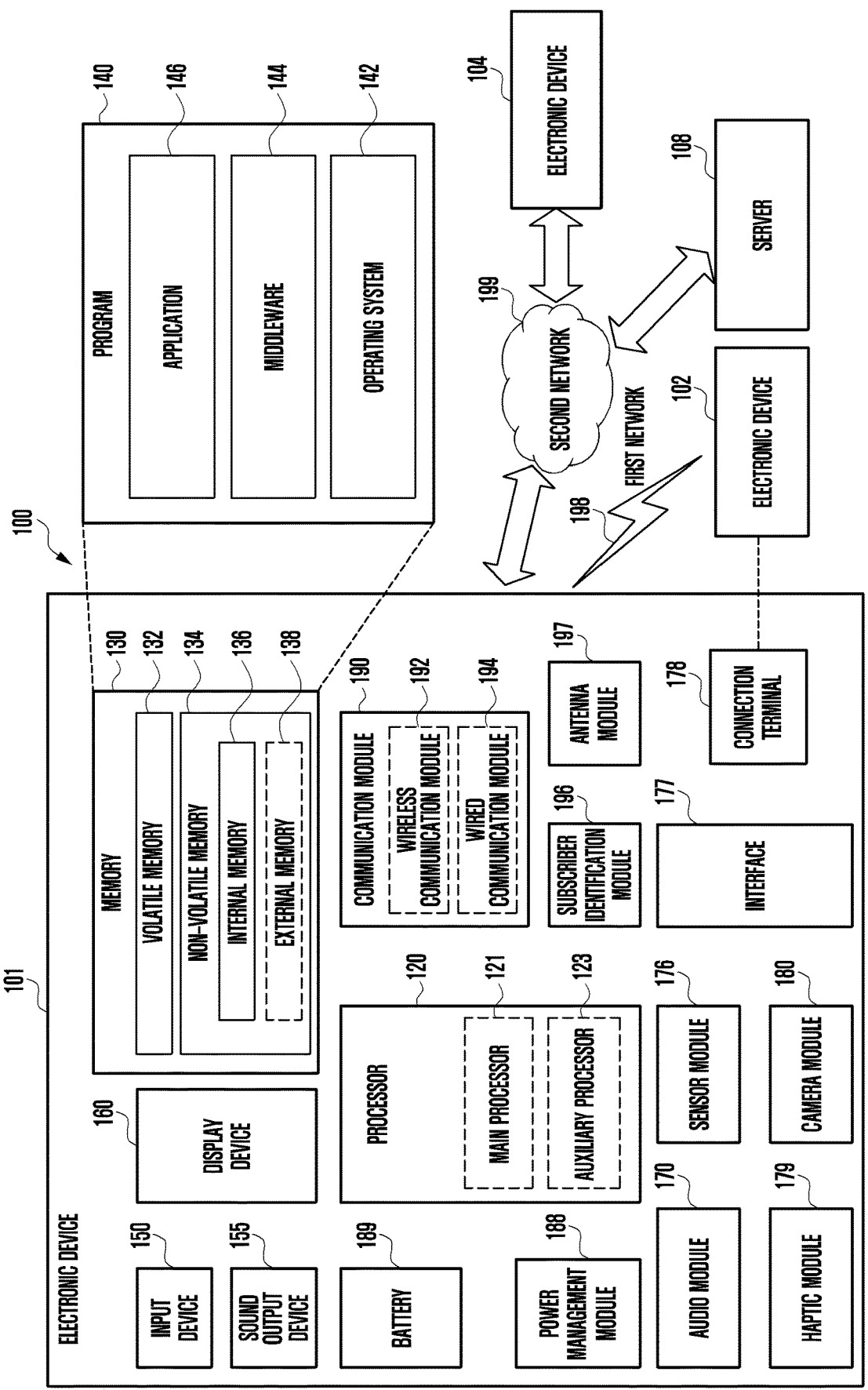
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
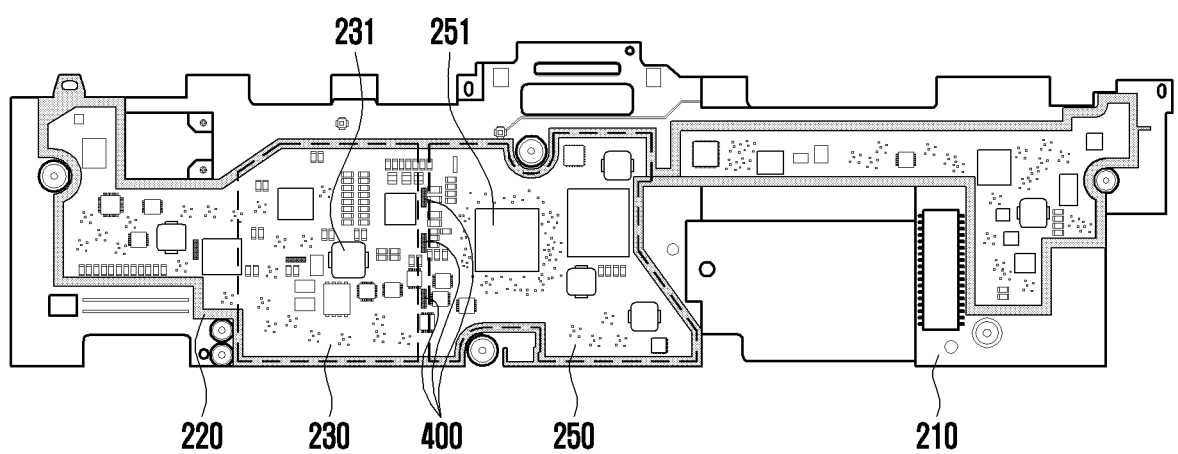
FIG. 2 is a plan view of a printed circuit board on which electronic components are mounted according to an embodiment of the disclosure.

FIG. 2 is a plan view of a printed circuit board in which electronic components are mounted according to an embodiment of the disclosure.

In a printed circuit board 210 according to various embodiments disclosed in the disclosure, various electronic components included in an electronic device (e.g., the electronic device 101 of FIG. 1) may be mounted. A shape of the printed circuit board 210 illustrated in FIG. 2 illustrates only one of various types of printed circuit boards 210, and a shape of the printed circuit board 210 described below is not limited to the shape of the printed circuit board 210 illustrated in FIG. 2.

Referring to FIG. 2, the printed circuit board 210 may include a first area 230 and a second area 250. The first area 230 and the second area 250 may mean areas in which electronic components may be mounted in the printed circuit board 210. The printed circuit board 210 may further include an area in which electronic components may be mounted in addition to the first area 230 and the second area 250 described above. The first area 230 and the second area 250 may be substantially partitioned by at least one conductive member 400.

According to various embodiments, the fact that the first area 230 and the second area 250 may be substantially partitioned by the conductive member 400 may mean that there is a difference of 10% or more in the magnitude of electrical noise for a specific frequency measured at the center of the first area 230 and the second area 250 divided by the disposition of the conductive member 400.

According to various embodiments, electronic components having similar driving frequencies may be disposed adjacent to each other on the printed circuit board 210 in consideration of driving efficiency of electronic components included in the electronic device. When electronic components having different driving frequencies are disposed adjacent to each other, a driving frequency of each electronic component may act as a disturbance or noise in the operation of the adjacent electronic components. Further, by disposing electronic components having similar driving frequencies to be adjacent to each other, it may be easy to shield electromagnetic interference (EMI) for a corresponding frequency. For example, electronic components having a first frequency as a driving frequency may be mainly mounted in the first area 230 of the printed circuit board 210, and electronic components having a second frequency as a driving frequency may be mainly mounted in the second area 250 thereof. The first frequency may be a relatively lower frequency compared to the second frequency. For example, the first frequency may be a frequency of a kilohertz (KHz) or megahertz (MHz) unit, and the second frequency may be a frequency of a gigahertz (GHz) unit. All driving frequencies of electronic components mounted in the first area 230 are not the same as the first frequency, and all driving frequencies of electronic components mounted in the second area 250 may not be the same as the second frequency. A driving frequency of electronic components mounted in the first area 230 may be substantially lower than that of electronic components mounted in the second area 250.

According to various embodiments, a power management integrated circuit (PMIC) 231 (e.g., the power management module 188 of FIG. 1) may be mounted in the first area 230 of the printed circuit board 210. The PMIC 231 may mean an integrated circuit that converts and manages input power so that power consumed by various components of the electronic device may be stably supplied. The PMIC 231 may operate in a frequency band of several kilohertz to several megahertz. In addition, electronic components related to power may be mounted in the first area 230 of the printed circuit board 210.

According to various embodiments, a processor 251 (e.g., the processor 120 of FIG. 1) may be mounted in the second area 250 of the printed circuit board 210. The processor 251 may have a driving frequency (drive clock) of several gigahertz. In addition, electronic components mainly linked to the operation of the processor 251 may be mounted in the second area 250 of the printed circuit board 210. For example, a memory (e.g., the memory 130 of FIG. 1) may be mounted in the second area 250 of the printed circuit board 210.

According to various embodiments, a first ground portion 220 may be formed in an outer portion of the first area 230 and the second area 250 of the printed circuit board 210. The first ground portion 220 may be a conductive line. The first ground portion 220 may be a ground to be a reference of a potential in the printed circuit board 210. The shielding film 300 may be attached to the first ground portion 220.

According to various embodiments, the shielding member disclosed in the disclosure may include a shielding film 300 and a conductive member 400.

According to various embodiments, a first processor (e.g., the auxiliary processor 123 of FIG. 1) may be mounted in the first area 230 of the printed circuit board 210, and a second processor (e.g., the main processor 121 of FIG. 1) may be mounted in the second area 250 of the printed circuit board 210. The second processor may be driven by a higher driving frequency (drive clock) than that of the first processor.

Figure 3A:
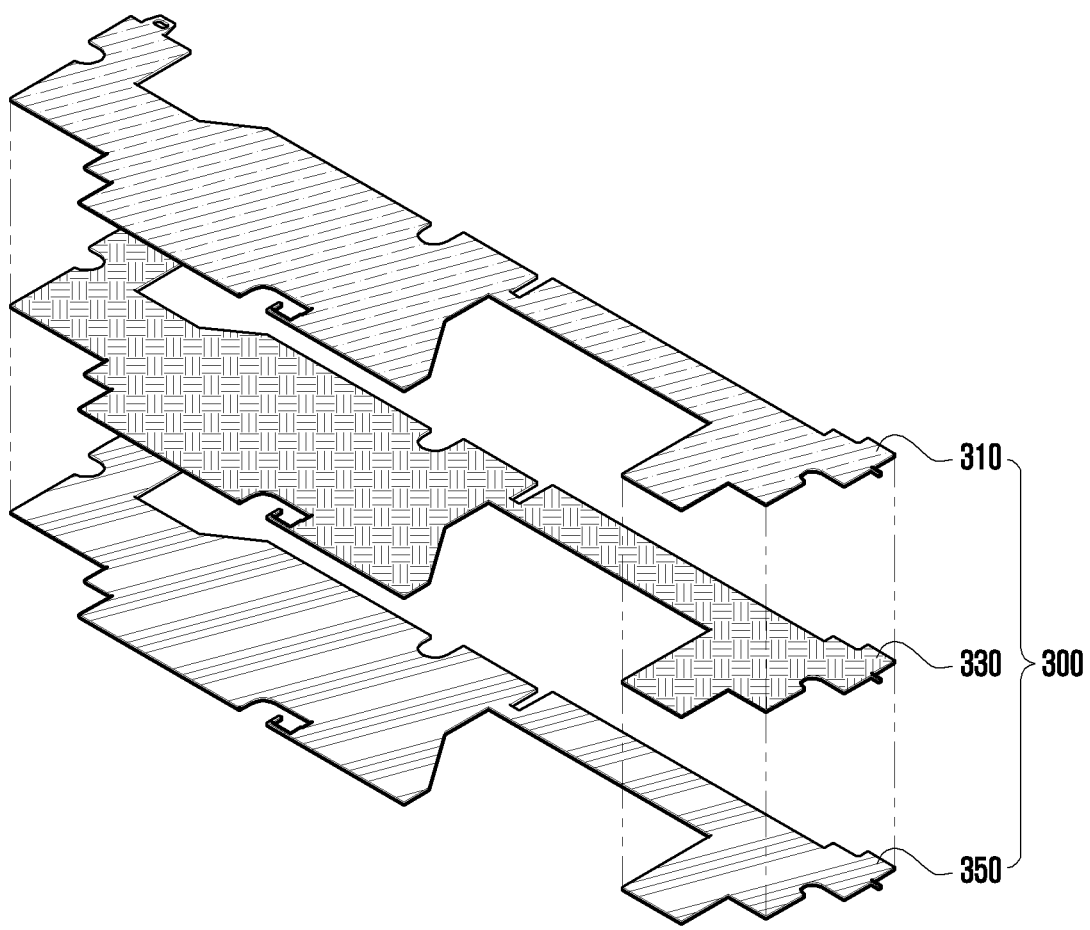
FIG. 3A is an exploded perspective view of a shielding film according to an embodiment of the disclosure.
Figure 3B:
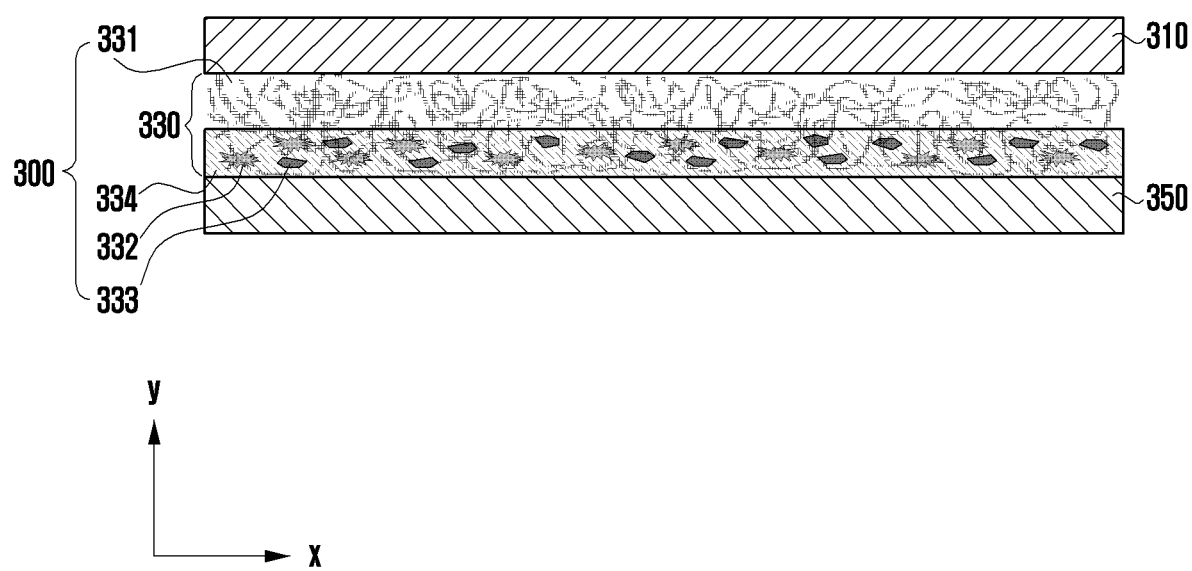
FIG. 3B is a cross-sectional view of a shielding film according to an embodiment of the disclosure.

FIG. 3A is an exploded perspective view of a shielding film according to an embodiment of the disclosure, and FIG. 3B is a cross-sectional view of a shielding film according to an embodiment of the disclosure.

Referring to FIG. 3A, a shielding film 300 according to various embodiments disclosed in the disclosure may be produced in the form of a plate-shaped film. In consideration of ease of shaping of the shielding film 300, the shielding film 300 may be made of a material that can be softened by a heat. The shielding film 300 may be disposed to cover various electronic components mounted in the printed circuit board 210. The shielding film 300 may be attached to the first ground portion 220 formed in the printed circuit board 210. A width of the first ground portion 220 may be determined so that the shielding film 300 may be stably attached to the first ground portion 220 of the printed circuit board 210.

According to various embodiments, the shielding film 300 may include a first insulating layer 310, a second insulating layer 350, and a first shielding layer 330. Referring to FIG. 3A, the shielding film 300 may be formed by stacking in order of the first insulating layer 310, the first shielding layer 330, the second insulating layer 350. However, such a stacked structure of the shielding film 300 is only an example, and the stacked structure of the shielding film 300 may be changed to a form different from that illustrated in FIG. 3A. For example, the second insulating layer 350 may be removed in some sections of the shielding film 300 (see FIG. 6B). Further, a second shielding layer (e.g., a second shielding layer 370 of FIG. 6B) may be additionally stacked in some sections of the shielding film 300. The second shielding layer 370 may be, for example, stacked between the first shielding layer 330 and the second insulating layer 350.

The first shielding layer 330 may shield noise so that noise generated in various electronic components mounted in the printed circuit board 210 does not leak outside of the shielding film 300. The first shielding layer 330 may include a nanofiber layer 331 and conductive particles 332 and 333. The conductive particles may include at least one of metal particles 332 and graphite particles 333.

The nanofiber layer 331 of the first shielding layer 330 may be made of nanofibers. The nanofibers constituting the nanofiber layer 331 may be made of various materials. For example, the nanofibers may be made of polyester or polyimide. A thickness of the nanofiber may be 1 um to 20 um. In addition, it is possible to configure the nanofiber layer 331 with nanofibers of various thicknesses, as needed. The nanofibers may be metal plated so that the nanofiber layer 331 has electrical conductivity. A thickness of the nanofiber layer 331 may be 10 um to 20 um. For example, the thickness of the nanofiber layer 331 may be 15 um. A density of the nanofibers constituting the nanofiber layer 331 in a thickness range of the nanofiber layer 331 may be 0.8 g/cm$^3$ to 0.9 g/cm$^3$.

As described above, in order for the nanofiber layer 331 to exhibit electrical conductivity, a metal plating treatment may be performed on the nanofiber. When the density of the nanofibers is less than 0.8 g/cm$^3$, the nanofiber layer 331 may not have sufficient electrical conductivity for noise shielding. When the density of the nanofibers exceeds 0.9 g/cm$^3$, a metal may not be sufficiently plated up to the nanofibers positioned inside the nanofiber layer 331. In this case, a current may not sufficiently flow in a direction (Y direction based on FIG. 3B) perpendicular to the longitudinal direction (X direction based on FIG. 3B) of the nanofiber layer 331. When a current does not appropriately flow in a vertical direction of the nanofiber layer 331, the nanofiber layer 331 may be substantially separated into two or more conductive layers. When the nanofiber layer 331 is separated into two or more conductive layers, resistance may increase and a noise shielding performance may decrease. In some cases, according to the length of the conductive layer separated into two or more, there is a risk of occurrence of a side effect in which noise is amplified because of resonance between noises of each conductive layer. Therefore, it may be preferable that the density of the nanofibers is 0.8 g/cm$^3$ to 0.9 g/cm$^3$. The nanofiber layer 331 made of nanofibers plated within this density range may have electrical conductivity required to shield noise, and because a current flows smoothly in the vertical direction, a phenomenon may be prevented that the nanofiber layer 331 is separated into two conductive layers. For example, the density of the nanofibers may be 0.86 g/cm$^3$.

According to various embodiments of the disclosure, metal plating processing on nanofibers may include coating an electrically conductive polymer material on the nanofibers.

The nanofiber layer 331 made of flexible nanofibers has a high elastic modulus. The first shielding layer 330 including the nanofiber layer 331 may be effectively disposed in a curved portion. Even if stress occurs according to an external force applied to the first shielding layer 330, the resulting strain is low; thus, the first shielding layer 330 may maintain a contact state with the first ground portion 220, and there is no fear that cracks occur therein. Therefore, the first shielding layer 330 including nanofibers may maintain a shielding performance for a long time. For example, the first shielding layer 330 including the nanofiber layer 331 made of nanofibers may have an advantage having very high reliability.

The nanofiber layer 331 may be coated with an adhesive material 334 so as to exhibit adhesiveness. According to various embodiments, the adhesive material 334 may be a liquid or solid state (e.g., powder, flake) material and be adhered by drying, pressure, contact, chemical reaction, or heat.

The metal particles 332 and the graphite particles 333 may be disposed in the nanofiber layer 331 so as to fill an empty space formed between the nanofibers. After the metal particles 332 and the graphite particles 333 are mixed with the adhesive material, when the adhesive material is coated on the nanofiber layer 331, the metal particles 332 and the graphite particles 333 may be disposed between the nanofibers in a portion coated with an adhesive material. The metal particles 332 may be particles made of a highly conductive metal such as nickel, aluminum, or copper. The graphite particles 333 may be particles having a size larger than that of the metal particles 332. A volume occupied by the graphite particles 333 in the nanofiber layer 331 may be larger than that occupied by the metal particles 332 in the nanofiber layer 331. In this way, the metal particles 332 and the graphite particles 333 fill an empty space formed between the nanofibers; thus, electrical conductivity of the nanofiber layer 331 may be improved. For example, the vertical direction current flow of the nanofiber layer 331 may be smooth.

The first insulating layer 310 and the second insulating layer 350 may electrically block a portion covered by the shielding film 300 and other portions. To this end, the first insulating layer 310 and the second insulating layer 350 may be made of a material having low electrical conductivity. For example, the first insulating layer 310 and the second insulating layer 350 may be formed with a dielectric. The first insulating layer 310 and the second insulating layer 350 may be formed in the form of a plate-shaped film.

Figure 4:
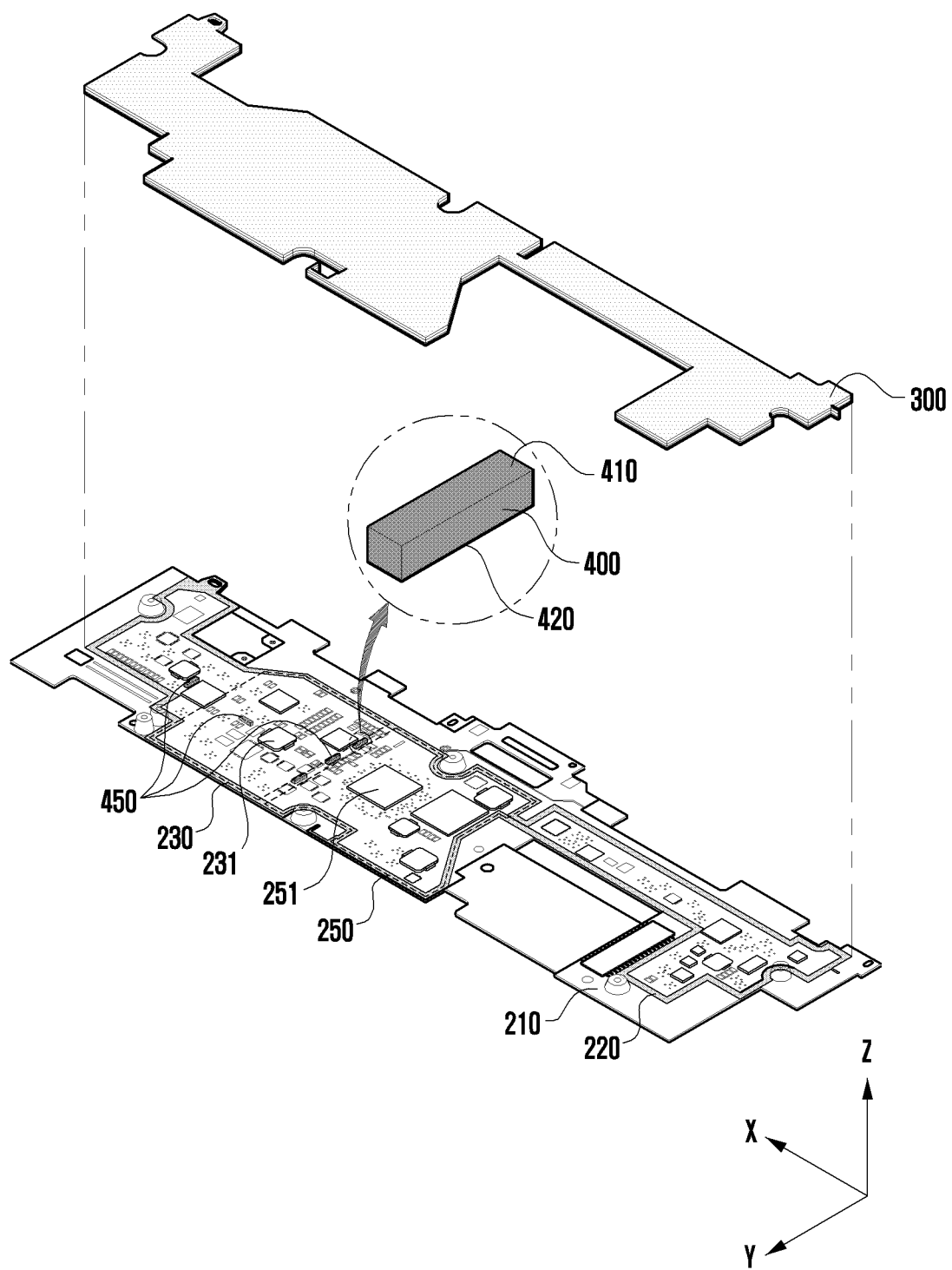
FIG. 4 is an exploded perspective view of a printed circuit board and a shielding film according to an embodiment of the disclosure.

FIG. 4 is an exploded perspective view of a printed circuit board and a shielding film according to an embodiment of the disclosure.

As illustrated in FIG. 4, the shielding film 300 according to various embodiments disclosed in the disclosure may be formed to cover both the first area 230 and the second area 250 of the printed circuit board 210. The shielding film 300 covering the first area 230 and the second area 250 at one time may be formed larger than at least an area of the first area 230 and the second area 250 of the printed circuit board 210 so as to cover the first area 230 and the second area 250 of the printed circuit board 210 at one time. A shape of the shielding film 300 illustrated in FIG. 4 is only an example, and the shape of the shielding film 300 may be changed much according to the disposition of electronic components on the printed circuit board 210.

According to various embodiments, an outer portion of the shielding film 300 may be attached to the first ground portion 220 formed in an outer portion of the first area 230 and the second area 250 of the printed circuit board 210.

According to various embodiments, a conductive member 400 may be disposed between the first area 230 and the second area 250 of the printed circuit board 210. The conductive member 400 may be made of a conductive material. The conductive member 400 may be formed to extend in a direction (e.g., the Z direction of FIG. 4) perpendicular to an extending direction (e.g., the X direction or the Y direction of FIG. 4) of the printed circuit board 210. The conductive member 400 may include a first end 410 and a second end 420. The first end 410 and the second end 420 of the conductive member 400 may mean both ends of the conductive member 400. The first end 410 of the conductive member 400 may contact the shielding film 300, and the second end 420 thereof may contact a second ground portion 270 formed in the printed circuit board 210.

According to various embodiments, as illustrated in FIG. 4, a plurality of conductive members 400 may be provided and disposed between the first area 230 and the second area 250 of the printed circuit board 210. The conductive member 400 may be disposed between the first area 230 and the second area 250 of the printed circuit board 210 in a state spaced apart from each other at a predetermined interval. One conductive member 400 rather than the plural may be disposed between the first area 230 and the second area 250.

According to various embodiments, unlike the plurality of conductive members 400 described above, the conductive member may be formed to extend continuously along a portion between the first area and the second area of the printed circuit board.

The first area 230 and the second area 250 of the printed circuit board 210 may be partitioned by the conductive member 400.

According to various embodiments, an auxiliary conductive member 450 may be disposed in the printed circuit board 210. For example, the auxiliary conductive member 450 may be disposed in at least one of the first area 230 and the second area 250 of the printed circuit board 210. In addition, the auxiliary conductive member 450 may be disposed in an arbitrary space on the printed circuit board 210. Similar to the above-described conductive member 400, the auxiliary conductive member 450 may be formed to extend in a direction (e.g., the Z direction of FIG. 4) perpendicular to an extending direction (e.g., the X direction or the Y direction of FIG. 4) of the printed circuit board 210. One of both ends of the auxiliary conductive member 450 may contact the shielding film 300 and the other one may contact the printed circuit board 210. The auxiliary conductive member 450 may serve as a guide for aligning the shielding film 300 with the printed circuit board 210 in a process of bonding the shielding film 300 and the printed circuit board 210 to each other.

According to various embodiments, the plurality of conductive members 400 or the auxiliary conductive members 450 may be metallurgically bonded onto a surface of the printed circuit board 210 through a surface mount technology (SMT) process. For example, the plurality of conductive members 400 or the auxiliary conductive members 450 may shorten circuit wiring in a structure without a lead, thereby improving high frequency characteristics.

Figure 5:
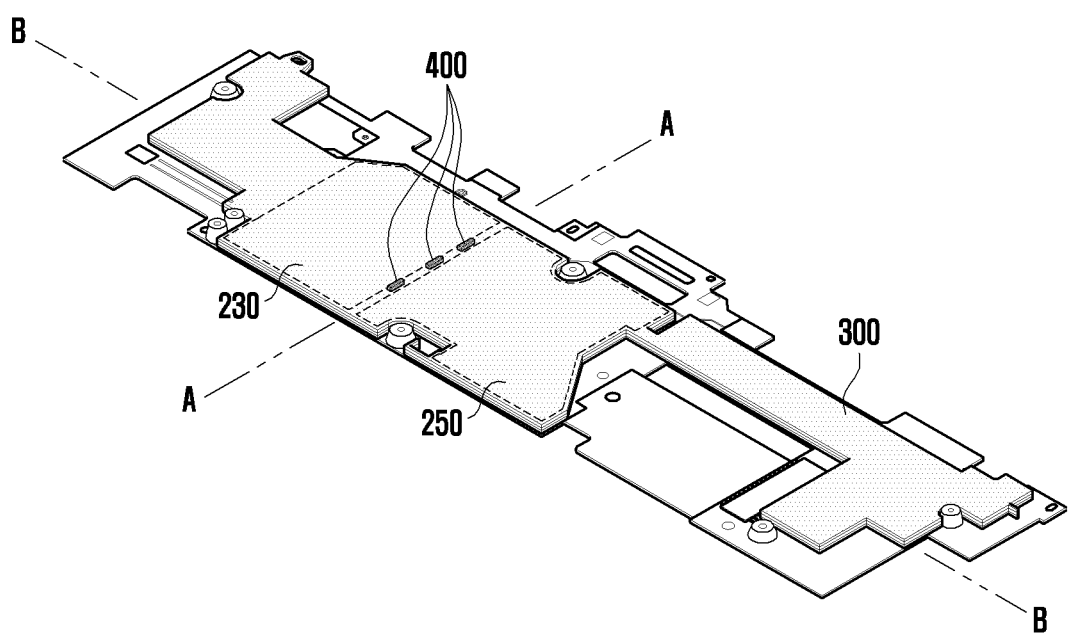
FIG. 5 is a perspective view of a state in which a shielding film is attached to a printed circuit board according to an embodiment of the disclosure.
Figure 6A:
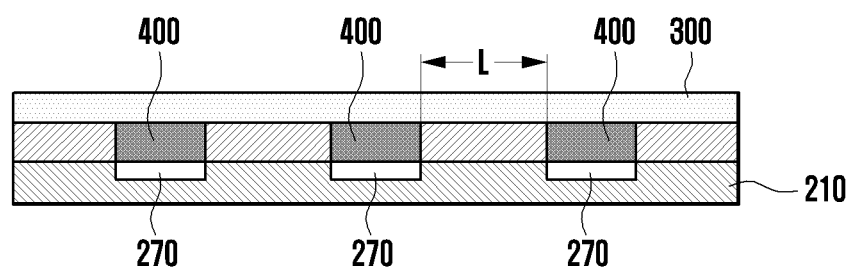
FIG. 6A is a cross-sectional view taken along line A-A of the printed circuit board illustrated in FIG. 5 according to an embodiment of the disclosure.

FIG. 5 is a perspective view illustrating a state in which a shielding film is attached to a printed circuit board according to an embodiment of the disclosure, FIG. 6A is a cross-sectional view of the printed circuit board taken along line AA illustrated in FIG. 5, and FIG. 6B is a cross-sectional view of the printed circuit board taken along line BB illustrated in FIG. 5.

With reference to FIG. 5, the shielding film 300 according to various embodiments disclosed in the disclosure may be disposed on the printed circuit board 210 so as to cover both the first area 230 and the second area 250 of the printed circuit board 210.

According to various embodiments of the present disclosure, as illustrated in FIG. 5, the plurality of conductive members 400 may be disposed between the first area 230 and the second area 250 of the printed circuit board 210 so as to partition the first area 230 and the second area 250 of the printed circuit board 210. The conductive member 400 may block electromagnetic waves so that electromagnetic waves generated in a driving process of electronic components (e.g., the PMIC 231) mounted in the first area 230 of the printed circuit board 210 do not to affect the electronic component (e.g., the processor 251) mounted in the second area 250 of the printed circuit board 210. The electromagnetic waves blocked by the conductive member 400 may flow along the first ground portion 220 of the printed circuit board 210 in contact with the conductive member 400.

According to various embodiments of the present disclosure, as illustrated in FIG. 6A, the conductive members 400 may be disposed to be spaced apart from each other at predetermined intervals. A separation distance L of the conductive member 400 may be determined based on driving frequencies of electronic components mounted in the first area 230 of the printed circuit board 210. Thereby, it is possible to prevent electromagnetic waves having a driving frequency band of electronic components mounted in the first area 230 of the printed circuit board 210 from passing through the conductive members 400 spaced at predetermined intervals. For example, the separation distance L of the conductive member 400 may be determined based on a driving frequency (e.g., first frequency) of the electronic component mounted in the first area 230 of the printed circuit board 210. In one embodiment, the separation distance L of the conductive member 400 may be determined to be less than 1/32 or less than 1/16 of a wavelength according to the driving frequency of the electronic component mounted in the first area 230. When the separation distance L is determined as described above, electromagnetic waves generated from the electronic component mounted in the first area may not pass through the conductive member 400. For example, when a speed of light is $3 \times 10^8$ m/s, if a driving frequency of the electronic component mounted in the first area 230 is 10 MHz, a wavelength may be 30 m. In this case, the separation distance L of the conductive member 400 may be determined to be smaller than 0.94 m obtained by dividing 30 m by 32. As another example, when the driving frequency of the electronic component mounted in the first area 230 is 100 MHz, the wavelength may be 3 m. In this case, the separation distance L of the conductive member 400 may be determined to be smaller than 0.09 m obtained by dividing 3 m by 32. The driving frequency of the electronic component mounted in the first area 230 of the printed circuit board 210 may not pass through between the conductive members 400 spaced apart by the above-described separation distance L. Thereby, electromagnetic waves generated by driving electronic components mounted in the first area 230 of the printed circuit board 210 may minimize a phenomenon that affects the driving of the electronic components mounted in the second area 250 of the printed circuit board 210. The conductive member 400 provided in the plural and spaced apart from each other at a predetermined interval may effectively prevent electromagnetic waves that may occur in the first area 230 of the printed circuit board 210 from overpassing the second area 250 of the printed circuit board 210.

In this way, when the conductive member 400 is spaced apart from each other at a predetermined interval, a space used for the ground between the first area 230 and the second area 250 of the printed circuit board 210 may be reduced because of the area of the conductive member 400 itself. Accordingly, a space between the first area 230 and the second area 250 may be utilized. For example, it may be possible to mount an electronic component between the conductive members 400.

When a separate shielding film 300 is applied to each of the first area 230 and the second area 250 of the printed circuit board 210, a ground portion similar to the first ground portion 220 formed in an outer portion of the first area 230 and the second area 250 illustrated in FIG. 4 may be required between the first area 230 and the second area 250. When the first area 230 and the second area 250 are covered with a separate shielding film 300, each of a ground portion for the shielding film 300 attached to the first area 230 and a ground portion for the shielding film 300 attached to the second area 250 may be required between the first area 230 and the second area 250. As described above, when the first area 230 and the second area 250 are shielded by the separate shielding film 300, a ground area corresponding to at least twice the width of the first ground portion 220 may be required. Thereby, a space in which electronic components can be mounted in the printed circuit board 210 may be reduced. In the case of the electronic device disclosed in the disclosure, the conductive member 400 partitions the first area 230 and the second area 250 of the printed circuit board 210; thus, the first area 230 and the second area 250 may be covered with one shielding film 300. A width of the first ground portion 220 to which the shielding film 300 of a flexible material is attached may be larger than that of the second ground portion 270 in which the conductive member 400 contacts. When the conductive member 400 partitions the first area 230 and the second area 250, a ground area corresponding to the width of the second ground portion 270 smaller than the width of the first ground portion 220 may be required between the first area 230 and the second area 250. Accordingly, the ground area between the first area 230 and the second area 250 may be minimized.

According to various embodiments, a height of the conductive member 400 may be equal to or greater than that of electronic components adjacent to the conductive member 400.

According to various embodiments of the present disclosure, as illustrated in FIG. 6B, in some sections of the shielding film 300, a second insulating layer 350 may be removed or the second shielding layer 370 may be added.

According to various embodiments, the second insulating layer 350 of the shielding film 300 may be removed in a section in contact with an electronic component having a high heat generation rate. An example of an electronic component having a high heat generation rate may be the processor 251. As illustrated in FIG. 6B, the second insulating layer 350 of the shielding film 300 may be removed in a section in contact with the processor 251. In this case, the processor 251 may directly contact the first shielding layer 330 of the shielding film 300. As previously described, because the first shielding layer 330 may be made of a conductive material, thermal conductivity may be high. A heat generated from the processor is transferred directly to the first shielding layer 330 without passing through the second insulating layer 350; thus, the heat generated from the processor may be more efficiently transferred to a heat dissipation member 600 disposed on the shielding film 300. According to various embodiments, the first insulating layer 310 may also be removed in an area corresponding to an area in which the second insulating layer 350 is removed. In this case, a heat generated in the processor 251 by contacting the heat dissipation member 600, the first shielding layer, the processor 251 may be directly transferred to the heat dissipating member 600 through the first shielding layer 330. The heat dissipation member 600 may be, for example, a thermal interface material (TIM). The TIM may be made of a material that can effectively transfer a heat. Accordingly, the heat generation control of the processor 251 may be facilitated.

According to various embodiments, a heat transfer member (not illustrated) may be disposed between the first shielding layer 330 and the processor 251. The heat transfer member may be made of a material having high thermal conductivity. A heat generated by the processor 251 may be transferred to the first shielding layer 330 through the heat transfer member. The heat transfer member disposed between the processor 251 and the first shielding layer 330 may effectively transfer a heat generated from the processor 251 to the first shielding layer 330.

According to various embodiments, in a section covering the first area 230 of the printed circuit board 210, the second shielding layer 370 may be additionally stacked on the shielding film 300. The second shielding layer 370 may be stacked between the first shielding layer 330 and the second insulating layer 350. The second shielding layer 370 may be formed with nanocrystal having magnetic permeability of several thousand or more in a low frequency (e.g., several megahertz or less) band. As described above, in the first area 230, electronic components having a low frequency band as a driving frequency may be mainly mounted. By additionally stacking the second shielding layer 370 that effectively absorbs electromagnetic waves in a low frequency band on the shielding film 300 covering the first area 230 of the printed circuit board 210, electromagnetic waves generated in the first area 230 may be more effectively shielded.

According to various embodiments, it is also possible to configure the second shielding layer 370 to have different magnetic permeability. A frequency of electromagnetic waves in which the second shielding layer 370 can absorb may be different according to magnetic permeability. Electronic components mounted in the printed circuit board 210 may generate electromagnetic waves of different frequencies. When the second shielding layer 370 having magnetic permeability capable of effectively absorbing electromagnetic waves generated from each electronic component is used, electromagnetic waves generated from the corresponding electronic component may be more effectively absorbed.

For example, as the second shielding layer 370 has different magnetic permeability, the second shielding layer 370 may more effectively absorb noise of various bands generated from electronic components.

With reference to FIG. 6B, in the second insulating layer 350 stacked on a lower surface of the first shielding layer 330, a portion contacting the first ground portion 220 may be cut. Thereby, the first ground portion 220 and the first shielding layer 330 of the shielding film 300 may be in direct contact.

An electronic device according to various embodiments disclosed in the disclosure may include a printed circuit board including a first area in which electronic components having a first frequency as a driving frequency are mounted and a second area in which electronic components having a second frequency as a driving frequency are mounted; a shielding film disposed to cover the first area and the second area of the printed circuit board and attached to a first ground portion of the printed circuit board; and at least one conductive member formed to extend in a direction perpendicular to an extending direction of the printed circuit board so that a first end contacts the shielding film and a second end contacts a second ground portion of the printed circuit board and disposed between the first area and the second area of the printed circuit board.

Further, the first frequency may be a relatively low frequency compared to the second frequency.

Further, in the first area of the printed circuit board, a power management integrated circuit (PMIC) may be mounted, and in the second area of the printed circuit board, a processor may be mounted.

Further, a plurality of the conductive members may be provided and disposed to be spaced apart from each other at predetermined intervals.

Further, a separation distance of the conductive member may be determined based on the first frequency.

Further, the shielding film may include a first insulating layer, a second insulating layer, and a first shielding layer stacked between the first insulating layer and the second insulating layer.

Further, in the shielding film, in an area in contact with an electronic component having a high heat generation rate among electronic components mounted in the printed circuit board, the second insulating layer may be removed from the area so that the electronic component and the first shielding layer directly contact.

Further, the electronic device may further include a heat transfer member disposed between the first shielding layer of the shielding film and the electronic component having a high heat generation rate.

Further, in a partial area of the shielding film, a second shielding layer including nano crystal may be further stacked.

Further, the first shielding layer of the shielding film may include conductive nanofibers.

An electromagnetic shielding member according to various embodiments disclosed in the disclosure may include a shielding film disposed to cover both a first area of a printed circuit board on which electronic components having a first frequency as a driving frequency are mounted and a second area of the printed circuit board on which electronic components having a second frequency as a driving frequency are mounted, and attached to a first ground portion of the printing circuit board; and at least one conductive member formed to extend in a direction perpendicular to an extending direction of the printed circuit board so that a first end contacts the shielding film and a second end contacts a second ground portion of the printed circuit board and disposed between the first area and the second area of the printed circuit board.

Further, the first frequency may be a relatively low frequency compared to the second frequency.

Further, the shielding film may be disposed on the printed circuit board so as to cover a first area of the printed circuit board in which a power management integrated circuit (PMIC) is mounted and a second area of the printed circuit board in which a processor is mounted.

Further, a plurality of the conductive members may be provided and disposed to be spaced apart from each other at predetermined intervals.

Further, a separation distance of the conductive member may be determined based on the first frequency.

Further, the shielding film may include a first insulating layer, a second insulating layer, and a first shielding layer stacked between the first insulating layer and the second insulating layer.

Further, in the shielding film, in an area in contact with an electronic component having a high heat generation rate among electronic components mounted in the printed circuit board, the second insulating layer may be removed from the area so that the electronic component and the first shielding layer directly contact.

Further, the electromagnetic shielding member may further include a heat transfer member disposed between the first shielding layer of the shielding film and the electronic component having a high heat generation rate.

Further, in a partial area of the shielding film, a second shielding layer made of a material including nano crystal may be further stacked.

Further, the first shielding layer of the shielding film may include conductive nanofibers.

According to various embodiments disclosed in the disclosure, it is possible to improve an EMI shielding performance of a shielding member.

Further, a shielding member according to various embodiments disclosed in the disclosure may be made of a material having a high elastic modulus to have high shielding reliability.

Further, a shielding member according to various embodiments disclosed in the disclosure can effectively transfer a heat of an electronic component.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device, comprising:
a printed circuit board including:
  a first area in which first electronic components having a first frequency as a driving frequency are mounted, and
  a second area in which second electronic components having a second frequency as a driving frequency are mounted,
  the first frequency being lower than the second frequency;
a shielding film disposed to cover the first area and the second area of the printed circuit board and attached to a first ground portion of the printed circuit board; and
a plurality of conductive members, each of the conductive members being formed to extend in a direction perpendicular to an extending direction of the printed circuit board, wherein each of the conductive members include respectively:
a first end that contacts the shielding film, and
a second end that contacts a second ground portion of the printed circuit board, the second end being disposed between the first area and the second area of the printed circuit board, and
wherein a conductive member is separated from an adjacent conductive member by an interval determined based on the first frequency.

2. The electronic device of claim 1,
wherein in the first area of the printed circuit board, a power management integrated circuit (PMIC) is mounted, and
wherein in the second area of the printed circuit board, at least one processor is mounted.

3. The electronic device of claim 1, wherein the shielding film comprises:
a first insulating layer,
a second insulating layer, and
a first shielding layer stacked between the first insulating layer and the second insulating layer.

4. The electronic device of claim 3, wherein in the shielding film, in an area in contact with an electronic component having a high heat generation rate among the first and second electronic components mounted in the printed circuit board, the second insulating layer is removed from the area so that the electronic component and the first shielding layer are in directly contact.

5. The electronic device of claim 3,
wherein in the shielding film, in an area in contact with an electronic component having a high heat generation rate among the first and second electronic components mounted in the printed circuit board, the second insulating layer is removed from the area so that the first shielding layer is exposed, and
wherein the electronic device further comprises:
a heat transfer member disposed between the first shielding layer of the shielding film and the electronic component having a high heat generation rate.

6. The electronic device of claim 3, wherein in a partial area of the shielding film, a second shielding layer comprising one or more nano crystals is further stacked.

7. The electronic device of claim 3, wherein the first shielding layer of the shielding film comprises one or more conductive nanofibers.

8. An electromagnetic shielding member, comprising:
a shielding film disposed to cover both a first area of a printed circuit board on which first electronic components having a first frequency as a driving frequency are mounted and a second area of the printed circuit board on which second electronic components having a second frequency as a driving frequency are mounted, and attached to a first ground portion of the printing circuit board and the first frequency being lower than the second frequency; and
a plurality of conductive members, wherein each of the conductive members being formed to extend in a direction perpendicular to an extending direction of the printed circuit board,
wherein each of the conductive members includes respectively:
a first end that contacts the shielding film, and
a second end that contacts a second ground portion of the printed circuit board, the second end being disposed between the first area and the second area of the printed circuit board, and
wherein a conductive member is separated from an adjacent conductive member by an interval determined based on the first frequency.

9. The electromagnetic shielding member of claim 8, wherein the shielding film is disposed on the printed circuit board, to cover:
a first area of the printed circuit board in which a power management integrated circuit (PMIC) is mounted, and
a second area of the printed circuit board in which at least one processor is mounted.

10. The electromagnetic shielding member of claim 8, wherein the shielding film comprises:
a first insulating layer,
a second insulating layer, and
a first shielding layer stacked between the first insulating layer and the second insulating layer.

11. The electromagnetic shielding member of claim 10, wherein in the shielding film, in an area in contact with an electronic component having a high heat generation rate among the first and second electronic components mounted in the printed circuit board, the second insulating layer is removed from the area so that the electronic component and the first shielding layer are in directly contact.

12. The electromagnetic shielding member of claim 10,
wherein in the shielding film, in an area in contact with an electronic component having a high heat generation rate among the first and second electronic components mounted in the printed circuit board, the second insulating layer is removed from the area so that the first shielding layer is exposed, and
wherein the electromagnetic shielding member further comprises:
a heat transfer member disposed between the first shielding layer of the shielding film and the electronic component having a high heat generation rate.

13. The electromagnetic shielding member of claim 10, wherein in a partial area of the shielding film, a second shielding layer made of a material comprising one or more nano crystals is further stacked.

14. The electromagnetic shielding member of claim 10, wherein the first shielding layer of the shielding film comprises one or more conductive nanofibers.

* * * * *